United States Patent [19]

Vora et al.

[11] Patent Number: 4,503,598
[45] Date of Patent: Mar. 12, 1985

[54] METHOD OF FABRICATING POWER MOSFET STRUCTURE UTILIZING SELF-ALIGNED DIFFUSION AND ETCHING TECHNIQUES

[75] Inventors: Madhukar B. Vora, Los Gatos; Vikram M. Patel, Saratoga, both of Calif.

[73] Assignee: Fairchild Camera & Instrument Corporation, Mountain View, Calif.

[21] Appl. No.: 380,170

[22] Filed: May 20, 1982

[51] Int. Cl.[3] .................... H01L 21/22; H01L 21/467
[52] U.S. Cl. ........................................ 29/571; 29/578; 29/580; 148/187; 148/190; 156/649; 357/55; 357/23.4; 357/23.9
[58] Field of Search .......................... 29/571, 578, 580; 148/187, 190; 357/23 VD, 23 S, 55; 156/649

[56] References Cited

U.S. PATENT DOCUMENTS

| | | | |
|---|---|---|---|
| 4,003,126 | 1/1977 | Holmes et al. | 29/571 |
| 4,072,975 | 2/1978 | Ishitani | 357/23 VD |
| 4,181,542 | 1/1980 | Yoshida et al. | 148/190 X |
| 4,206,469 | 6/1980 | Hanes et al. | 357/55 X |
| 4,219,835 | 8/1980 | Van Loon et al. | 357/55 |
| 4,296,429 | 10/1981 | Schroeder | 357/23 VD |
| 4,345,265 | 8/1982 | Blanchard | 357/23 VD |
| 4,384,301 | 5/1983 | Tasch et al. | 357/23 S |
| 4,398,339 | 8/1983 | Blanchard et al. | 29/571 |
| 4,419,811 | 12/1983 | Rice | 29/571 |

OTHER PUBLICATIONS

Electronics–"Power Transistors Unite MOS, Bipolar", vol. 54, No. 7, Apr. 21, 1981, p. 44.

*Primary Examiner*—Willam G. Saba
*Attorney, Agent, or Firm*—Ronald C. Fish; Robert Colwell; Carl Silverman

[57] ABSTRACT

A power MOSFET semiconductor structure is fabricated using the steps of depositing an epitaxial layer 12 of N conductivity type silicon on an underlying silicon substrate 10 of N conductivity type, forming a plurality of polycrystalline silicon electrodes 18 on the epitaxial layer 12, each electrode 18 being separated from the epitaxial layer 12 by a layer of insulating material 15; introducing P 30 and N 33 conductivity type impurities into the epitaxial layer 12 between the electrodes 18, the P type impurity 30 underlying the N type impurity 33; removing regions of the epitaxial layer 12 to form openings 21 in the epitaxial layer 12 between the electrodes 18, the removed regions 21 extending through the N type region 33 but not through the P type region 30; and depositing electrically conductive material 40 in the opening 23.

The resulting semiconductor structure includes an N type substrate 10, an N type epitaxial layer 12, an opening 21 in the epitaxial layer 12 extending downward a selected distance, an upper N type region 33 surrounding the opening 21 and extending to the surface of the epitaxial layer 12, a lower P type region 30 which extends to the surface of the epitaxial layer 12 and everywhere separates the N type region 33 from epitaxial layer 12, an electrode 40 formed in the opening and extending to the upper surface of the epitaxial layer 12, and a second electrode 18 disposed above epitaxial layer 12 and separated from it by insulating material 15.

14 Claims, 7 Drawing Figures

METHOD OF FABRICATING POWER MOSFET STRUCTURE UTILIZING SELF-ALIGNED DIFFUSION AND ETCHING TECHNIQUES

BACKGROUND OF THE INVENTION

1. Field of the Invention

This invention relates to integrated circuit structures and processes for manufacturing them, and in particular to an improved power metal oxide semiconductor field effect transistor (MOSFET) structure having higher switching speeds and improved breakdown characteristics.

2. Description of the Prior Art

Continuing improvements in integrated circuit fabrication technology have lead to the manufacture of MOSFET's which are capable of efficient high frequency switching of relatively large amounts of power. The power MOSFET represents one of the first power semiconductor devices manufacturable using integrated circuit processing technology. A survey article discussing power MOSFET's is entitled "Switching Lots of Watts at High Speed" by B. Baliga, IEEE Spectrum, December 1981, pages 42-48.

One promising technology for the manufacture of advanced power MOSFET structures is VDMOS, meaning MOS devices fabricated using double diffusions in V-shaped grooves. Unfortunately conventionally fabricated VDMOS structures suffer from several disadvantages. Such devices are generally overly susceptible to secondary breakdown of parasitic bipolar transistors inherent in the structure. Furthermore, such structures typically have undesirably large drain to source resistance when on. In addition, the devices switch at undesirably low speeds in view of their relatively large size and therefore high gate capacitances.

SUMMARY OF THE INVENTION

This invention provides an improved power MOSFET structure and a method of manufacturing it, which result in a power MOSFET having improved performance characteristics over those of the prior art. In particular, this invention provides a power MOSFET structure which is less susceptible to secondary breakdown of parasitic transistors inherent in the integrated circuit structure, which has a lower drain to source resistance, and which is capable of switching at higher speeds with lower gate capacitance than prior art devices.

In one embodiment a semiconductor structure fabricated according to this invention includes a semiconductor drain region of first conductivity type having an upper surface; an opening in the drain region extending downward from the upper surface a selected distance; a source region of first conductivity type continguous to the opening and to the upper surface; a gate region of opposite conductivity type everywhere disposed between the source region and the drain region and extending to the surface of the drain region; a gate electrode disposed above all of the gate region and separated therefrom by insulating material, and means for providing electrical connections to the source region, the drain region, and the gate electrode.

In one embodiment a method for fabricating the power MOSFET structure comprises the step of forming an electrically conductive gate electrode on a semiconductor drain region of first conductivity type, the electrode being separated from the drain region by a layer of insulating material; introducing first and opposite conductivity type impurities into the drain region adjacent the electrode to thereby form source and gate regions, respectively, the opposite conductivity type underlying the first conductivity type; removing portions of the drain region to form openings adjacent the electrodes, the removed portions extending through the first conductivity type but not through the opposite conductivity type; and providing electrical connections to the drain region, the source region and the gate electrode.

BRIEF DESCRIPTION OF THE DRAWINGS

FIG. 1 is a cross-sectional view of a semiconductor structure which may be manufactured using known techniques.

FIG. 2 is a subsequent cross-sectional view after etching the structure shown in FIG. 1.

FIG. 3 is subsequent cross-sectional view after formation of additional insulating material.

FIG. 4 is subsequent cross-sectional view after introduction of P conductivity type impurity.

FIG. 5 is a subsequent cross-sectional view after further etching of the structure, and introduction of additional P type impurity.

FIG. 6 is cross-sectional view of the completed structure.

DETAILED DESCRIPTION OF THE PREFERRED EMBODIMENTS

Figure 1:
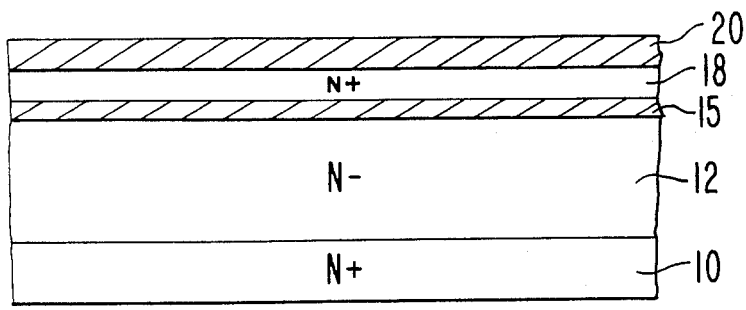
FIGS. 1 through 6 illustrate a method for fabricating a power MOSFET structure where.
Figure 4:
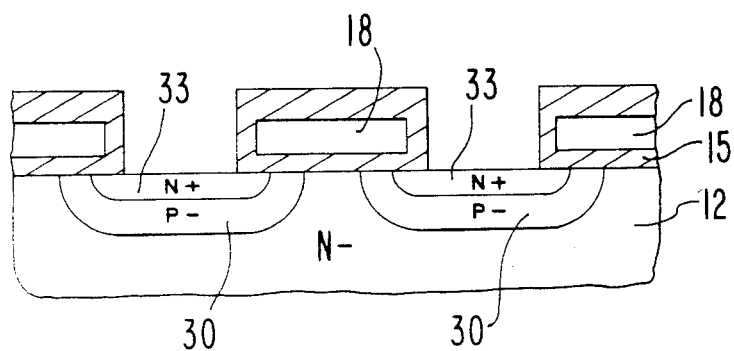
Figure 5:
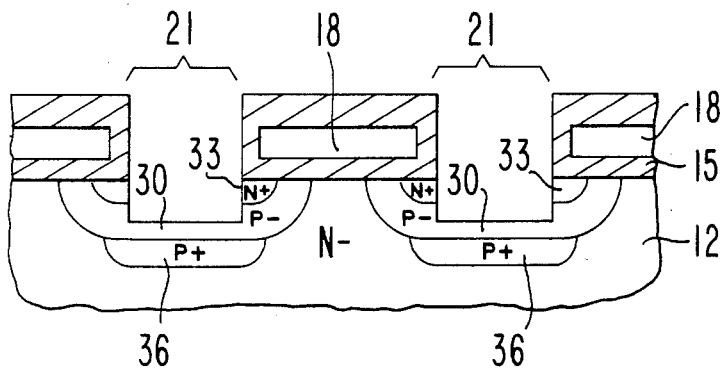
Figure 6:
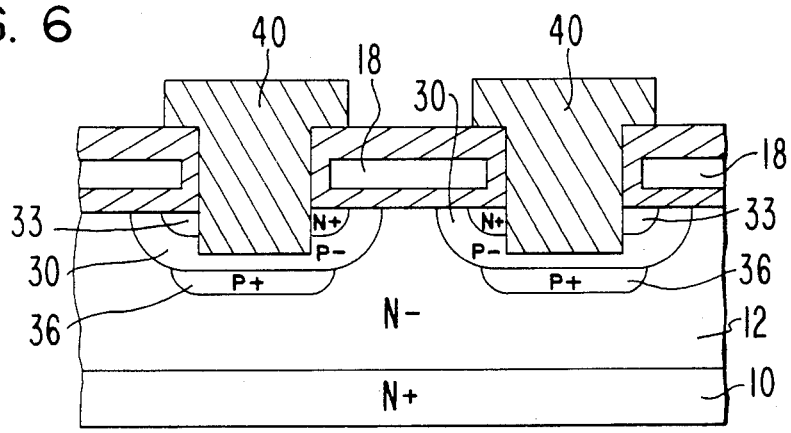

A cross-sectional view of the preferred embodiment of the semiconductor structure of this invention is shown in FIG. 6. FIGS. 1 through 6 illustrate a method by which this power MOSFET structure may be manufactured. FIG. 1 is a cross-sectional view of a semiconductor structure which may be fabricated using known processes. As shown in FIG. 1, a lightly doped N− conductivity type epitaxial silicon layer 12 is deposited on the upper surface of a heavily doped N+ conductivity type silicon substrate 10. In the preferred embodiment substrate 10 is a commercially available silicon substrate doped with antimony to an impurity concentration of $10^{19}$ atoms per cubic centimeter. Epitaxial layer 12 may be formed across the upper surface of substrate 10 using a suitable epitaxial reactor. In the preferred embodiment epitaxial layer 12 is 10-50 microns thick and has a phosphorous impurity concentration of $10^{14}$ atoms per cubic centimeter. Substrate 10 will function as an electrical contact to epitaxial silicon 12 which will become the drain of the MOSFET. On the upper surface of epitaxial layer 12 a relatively thin layer of silicon dioxide 15 is formed. In the preferred embodiment silicon dioxide 15 is 2000 Angstroms thick and is formed by heating the underlying structure to a temperature of 1000° C. for 2 hours in oxygen. Silicon dioxide 15 will become the gate oxide of the MOSFET.

On the upper surface of silicon dioxide 15 a layer of polycrystalline silicon 18 is deposited, for example, using chemical vapor deposition. Polycrystalline silicon 18 will typically be on the order of 8000 Angstroms thick and is doped with arsenic to an impurity concentration of $10^{20}$ atoms per cubic centimeter. Polycrystalline silicon 18 may be doped while it is being deposited, or impurities may be introduced into it after deposition using known diffusion or ion implantation processes. Regions of the conductive polysilicon 18 will become the gate electrodes. Finally, as shown in FIG. 1, on the upper surface of polycrystalline silicon 18 a second layer of silicon dioxide 20 is formed, for example, by heating the underlying structure to a temperature of 1000° C. for 30 minutes to create a layer 5000 Angstroms thick.

Figure 2:
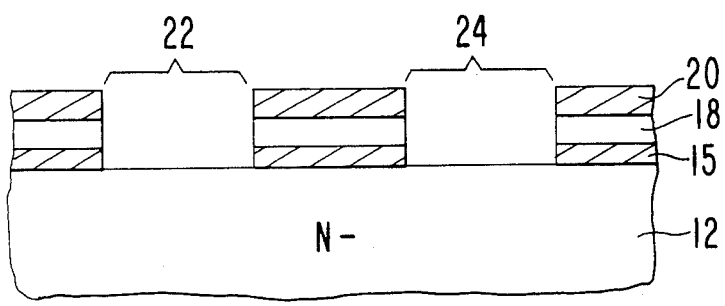

Using well-known integrated circuit fabrication technology, a suitable mask (not shown) is deposited and patterned on the upper surface of silicon dioxide 20. The underlying layers of silicon dioxide 15 and 20 and polycrystalline silicon 18 are then removed from regions 22 and 24 as shown by FIG. 2. In the preferred embodiment this etching step is performed using plasma or reactive ion etching to thereby create relatively vertical cuts through the "sandwich" structure formed by layers 15, 18 and 20. Suitable etch gases for removing the silicon dioxide layers 15 and 20 include carbon tetrafluoride, while polycrystalline silicon 18 may be removed using carbon tetrachloride. As will be evident, the polycrystalline silicon 18 will be allowed to remain on the structure wherever gate electrodes for the power MOSFET structure are desired.

Figure 3:
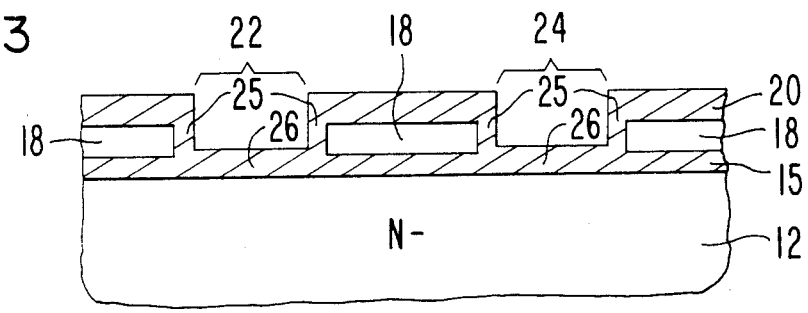

The structure shown in FIG. 2 is then oxidized by heating it to a temperature of 800° C. for 2 hours to create the silicon dioxide 25 and 26 shown in regions 22 and 24 of FIG. 3. The silicon dioxide forming on the side walls of the structure depicted will be approximately 3000 Angstroms thick, while that which forms directly on the surface of epitaxial silicon 12 will be approximately 8000 Angstroms thick. The silicon dioxide 25 on the side walls will serve to electrically isolate electrodes formed in regions 22 and 24 from the doped polycrystalline silicon gate electrodes 18. In addition, silicon dioxide 25 functions as a mask for the following etching step. The structure shown in FIG. 3 is then etched to remove the silicon dioxide 26 from the bottom of the central portion of regions 22 and 24 as shown by FIG. 4. This step may be accomplished using well-known plasma etching apparatus and carbon tetrafluoride etch gas.

Next, as also shown in FIG. 4, P and N conductivity type dopants are introduced into the upper surface of epitaxial layer 12 through the surfaces from which silicon dioxide 26 has been removed. These dopants form a P conductivity type region 30 and an N conductivity type region 33 in each opening. The dopants may be introduced using a variety of process operations. For example, in one embodiment the P conductivity type regions 30 are formed by ion implanting them below the surface of epitaxial layer 12. Then, using a lower implant energy, the N conductivity type regions 33 are fabricated closer to the upper surface of epitaxial material 12. The structure is then heated to a temperature of 1000° C. for 2 hours to allow the implanted regions to diffuse into the configuration shown in FIG. 4. Alternatively, a well-known double diffusion process may be performed to introduce these impurities. In the preferred embodiment the P type regions 30 will have a surface impurity concentration of $10^{17}$ boron atoms per cubic centimeter, while the N conductivity type regions 33 will have a surface impurity concentration of $10^{20}$ arsenic atoms per cubic centimeter.

Following the introduction and diffusion of these impurities any silicon dioxide formed on the surface of epitaxial material 12 is removed, and the silicon itself etched in the manner shown in FIG. 5. In the preferred embodiment expitaxial silicon 12 will be etched using a plasma or reative ion process to create an opening which has substantially vertical sides, is 4000 Angstroms deep and extends at least all the way through N conductivity type regions 33. In embodiments in which epitaxial material 12 is N type monocrystalline silicon, a well-known preferential chemical etch may be performed to create a V-groove structure.

After fabrication of openings 21 in epitaxial material 12, boron or other P conductivity type impurity may be implanted into the bottom of the openings 21 to form regions 36. Typically these regions will be doped to a concentration of $10^{20}$ atoms per cubic centimeter. If necessary the structure may then be heated to diffuse of the P type impurities 36 to form the structure shown in FIG. 5.

Next, as shown in FIG. 6, metal connections 40 are formed. These connections are typically formed by depositing a layer of aluminum across the entire upper surface of the structure and into openings 21. Using well-known masking and photolithographic techniques the metal layer is patterned into desired regions 40. Electrodes 40 function as contacts to the N conductivity type source regions and "short" source region 33 to gate region 30. The strongly doped N conductivity type wafer 10 is again shown in FIG. 6 to illustrate the manner in which any electrical connection to the drain 12 of the power MOSFET is made. In a typical embodiment all of the gate electrodes 18 will be electrically connected to each other, as will all source electrodes 40. In this manner, a single chip will be capable of controlling substantially more power than any single MOSFET therein.

Figure 7:
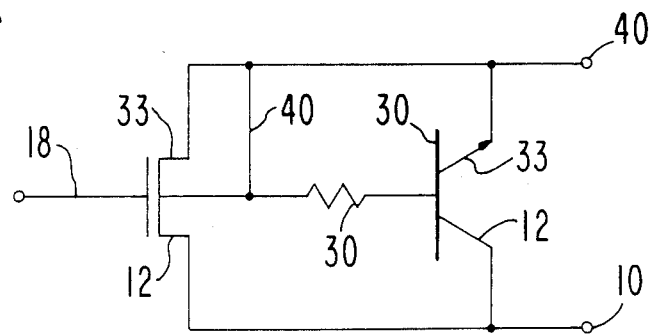
FIG. 7 is an electrical schematic of the structure shown in FIG. 6.

FIG. 7 is a schematic diagram of an equivalent discrete circuit to the integrated circuit structure shown in FIG. 6. As shown by FIG. 7 the power MOS device is formed by gate 30, source 33, drain 12, and gate electrode 18. Metal contact 40 provides an electrical connection to source 33, while region 10 provides a connection to drain 12. The parasitic bipolar transistor formed by the structure shown in FIG. 6 includes collector 12, emitter 33, and base 30.

The strongly doped P type regions 36 beneath the gate and parasitic base region 30 reduce the base resistance of the parasitic bipolar transistor. Because the breakdown voltage of the MOS device is usually limited by the collector-emitter breakdown voltage of the parasitic bipolar device, (which in turn is proportional to the product of the collector-base breakdown voltage and the base resistance), the lowered base resistance increases the overall power MOS device breakdown voltage. The breakdown voltage may be further increased by improving the transconductance of the structure by increasing the packing density of the MOS devices formed on a single chip. The lowered gate capacitance per unit cell resulting from self-alignment of the gate and source, provides an increased ratio of transconductance to gate capacitance, thereby improving switching speed.

Advantages of the structure depicted in FIG. 6 include a significant reduction in the base resistance of the parasitic bipolar NPN transistor. This results from the self-aligned edge of the N+ diffusion 33 with the edge of the overlying polycrystalline silicon gate 18. The self-alignment increases the collector-emitter breakdown voltage of the parasitic bipolar transistor. Furthermore, by virtue of its compact layout, the structure shown in FIG. 6 provides reduced source-drain resistance and increased transconductance over prior art structures.

Although one embodiment of the process and structure of this invention has been described above, this embodiment is intended only to illustrate the invention. Other uses of the structure will be apparent. For example by biasing the structure in an opposite manner, the source will become the drain, and the drain will become the source. The scope of the invention may be ascertained from the appended claims.

We claim:

1. A method of fabricating a semiconductor structure comprising:
   forming a pair of spaced apart electrically conductive gate electrodes on a semiconductor drain region of first conductivity type, the electrodes being separated from the drain region by a layer of insulating material;
   introducing first and opposite conductivity type impurity into the drain region between the spaced apart gate electrodes by using the gate electrodes to mask portions of the drain region to thereby form source and gate regions, respectively, the first conductivity type impurity being everywhere separated from the drain region by the opposite conductivity;
   removing a portion of the drain region between the spaced apart gate electrodes to form an opening extending through the source region but not through the gate region;
   depositing electrically conductive material into the opening in contact with both of the source and gate regions but not in contact with any of the drain region and not in contact with the gate electrodes; and
   providing electrical connections to each of the drain region, the gate electrodes, and the electrically conductive material deposited in the opening.

2. A method as in claim 1 wherein the step of forming a pair of spaced apart electrically conductive gate electrodes comprises:
   depositing a layer of polycrystalline silicon on the layer of insulating material; and
   removing a region of the layer of polycrystalline silicon to thereby form a pair of spaced apart gate electrodes.

3. A method as in claim 2 wherein following the step of removing a region, a step is performed comprising:
   coating each of the pair with insulating material.

4. A method as in claim 3 wherein the step of coating comprises oxidizing the gate electrodes.

5. A method as in claim 3 wherein the additional opposite conductivity type forms an opposite conductivity region beneath the gate region.

6. A method as in claim 1 wherein following the step of removing and prior to the step of depositing a step is performed comprising introducing additional opposite conductivity type impurity into the opening.

7. A method as in claim 6 wherein the step of depositing comprises depositing a metal.

8. A method as in claim 1 wherein the step of introducing first and opposite conductivity type comprises ion implanting first and opposite conductivity type.

9. A method in claim 8 wherein the step of introducing first and opposite conductivity type is followed by a step of diffusing the first and opposite conductivity type.

10. A method as in claim 1 wherein the step of removing portions comprises etching the drain region.

11. A method as in claim 10 wherein the step of etching the drain region comprises etching with a plasma.

12. A method as in claim 1 wherein the step of providing electrical connections further comprises forming the drain region on an underlying more heavily doped semiconductor substrate to thereby provide an electrical connection to the drain region.

13. A method as in claim 1 wherein the first conductivity type is N conductivity type.

14. A method of fabricating a semiconductor structure comprising:
   depositing first conductivity type epitaxial silicon having an upper surface on a first conductivity type silicon substrate;
   forming a plurality of polycrystalline silicon electrodes on the upper surface of the epitaxial layer but separated therefrom by a layer of silicon dioxide;
   introducing first and opposite conductivity type impurities into the epitaxial layer between the electrodes, by using the electrodes and underlying silicon dioxide to mask regions of the epitaxial layer, the opposite conductivity type impurity underlying the first conductivity type impurity;
   removing regions of the epitaxial layer between the electrodes to form openings in the epitaxial layer, the openings extending through the first conductivity type but not the opposite conductivity type;
   introducing additional opposite conductivity type impurity beneath the existing opposite conductivity type impurity; and
   forming metal electrodes in the openings.

* * * * *